(12) United States Patent
Bunea et al.

(10) Patent No.: US 9,941,435 B2
(45) Date of Patent: Apr. 10, 2018

(54) PHOTOVOLTAIC MODULE AND LAMINATE

(75) Inventors: Gabriela E. Bunea, Santa Clara, CA (US); Sung Dug Kim, Pleasanton, CA (US); David F. J. Kavulak, Fremont, CA (US)

(73) Assignee: SunPower Corporation, San Jose, CA (US)

( * ) Notice: Subject to any disclaimer, the term of this patent is extended or adjusted under 35 U.S.C. 154(b) by 1567 days.

(21) Appl. No.: 13/175,578

(22) Filed: Jul. 1, 2011

(65) Prior Publication Data

US 2013/0000694 A1    Jan. 3, 2013

(51) Int. Cl.
*H01L 31/0203* (2014.01)
*H01L 31/049* (2014.01)
*H01L 31/052* (2014.01)
*H01L 31/048* (2014.01)
(Continued)

(52) U.S. Cl.
CPC ............ *H01L 31/0522* (2013.01); *B32B 7/12* (2013.01); *B32B 27/08* (2013.01); *B32B 27/12* (2013.01);
(Continued)

(58) Field of Classification Search
CPC . H01L 31/048; H01L 31/0481; H01L 31/049; H01L 31/0522; B32B 2457/12;
(Continued)

(56) References Cited

U.S. PATENT DOCUMENTS 6,096,569 A * 8/2000 Matsuno et al. ................. 438/19
6,294,724 B1 * 9/2001 Sasaoka et al. .............. 136/251
(Continued)

OTHER PUBLICATIONS

Rakowska et al. "Influence of Different Test Conditions on Volume Resistivity of Polymeric Insulated Cables and POlyethylene Samples". Dielectric Materials, Measurements and Applications Conference Publication No. 472, published 2000, pp. 281-284.*
(Continued)

*Primary Examiner* — Jeffrey T Barton
*Assistant Examiner* — Andrew Golden
(74) *Attorney, Agent, or Firm* — Okamoto & Benedicto LLP

(57) ABSTRACT

A photovoltaic module is disclosed. The photovoltaic module has a first side directed toward the sun during normal operation and a second, lower side. The photovoltaic module comprises a perimeter frame and a photovoltaic laminate at least partially enclosed by and supported by the perimeter frame. The photovoltaic laminate comprises a transparent cover layer positioned toward the first side of the photovoltaic module, an upper encapsulant layer beneath and adhering to the cover layer, a plurality of photovoltaic solar cells beneath the upper encapsulant layer, the photovoltaic solar cells electrically interconnected, a lower encapsulant layer beneath the plurality of photovoltaic solar cells, the upper and lower encapsulant layers enclosing the plurality of photovoltaic solar cells, and a homogenous rear environmental protection layer, the rear environmental protection layer adhering to the lower encapsulant layer, the rear environmental protection layer exposed to the ambient environment on the second side of the photovoltaic module.

16 Claims, 3 Drawing Sheets

(51) Int. Cl.
　　*B32B 7/12*　　　(2006.01)
　　*B32B 27/08*　　(2006.01)
　　*B32B 27/12*　　(2006.01)
　　*B32B 27/32*　　(2006.01)

(52) U.S. Cl.
　　CPC ............ *B32B 27/32* (2013.01); *H01L 31/048* (2013.01); *H01L 31/049* (2014.12); *B32B 2262/101* (2013.01); *B32B 2307/31* (2013.01); *B32B 2307/402* (2013.01); *B32B 2307/414* (2013.01); *B32B 2457/12* (2013.01); *Y02E 10/50* (2013.01); *Y10T 428/2495* (2015.01)

(58) Field of Classification Search
　　CPC ... B32B 27/32; B32B 27/08; B32B 2307/402; B32B 2307/414
　　USPC .................................................. 136/251, 259
　　See application file for complete search history.

(56) References Cited

U.S. PATENT DOCUMENTS

| | | |
|---|---|---|
| 6,320,116 B1 * | 11/2001 | Hanoka .......................... 136/251 |
| 6,660,930 B1 | 12/2003 | Gonsiorawski |
| 2007/0295387 A1 | 12/2007 | Adriani et al. |
| 2010/0193024 A1 | 8/2010 | Karpinski et al. |
| 2010/0224235 A1 | 9/2010 | Takagi et al. |
| 2010/0263720 A1 | 10/2010 | Detje et al. |
| 2011/0048505 A1 * | 3/2011 | Bunea et al. ................. 136/251 |

OTHER PUBLICATIONS

International Search Report for Application No. PCT/US2012/033345, dated Sep. 24, 2012, 5 sheets.

* cited by examiner

PHOTOVOLTAIC MODULE AND LAMINATE

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

TECHNICAL FIELD

Embodiments of the subject matter described herein relate generally to photovoltaic modules and laminates. More particularly, embodiments of the subject matter relate to construction of laminates with high resistivity encapsulants.

BACKGROUND

Photovoltaic solar systems benefit from increased electrical and conversion efficiency and reduced cost. Both effects advantageously reduce the overall cost of energy produced by the solar system. One way to reduce cost is to reduce the complexity of the system. Another is to reduce the weight of the system.

Photovoltaic solar systems can be composed of a number of individually-constructed photovoltaic modules. Each module can contain and support a photovoltaic laminate. Reducing the weight or complexity of either can improve the system. Photovoltaic modules can be inspected to meet performance, reliability, safety, and manufacturing specifications. Advantageously, the innovations which improve the system cost or efficiency can permit the photovoltaic module to continue to meet specifications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
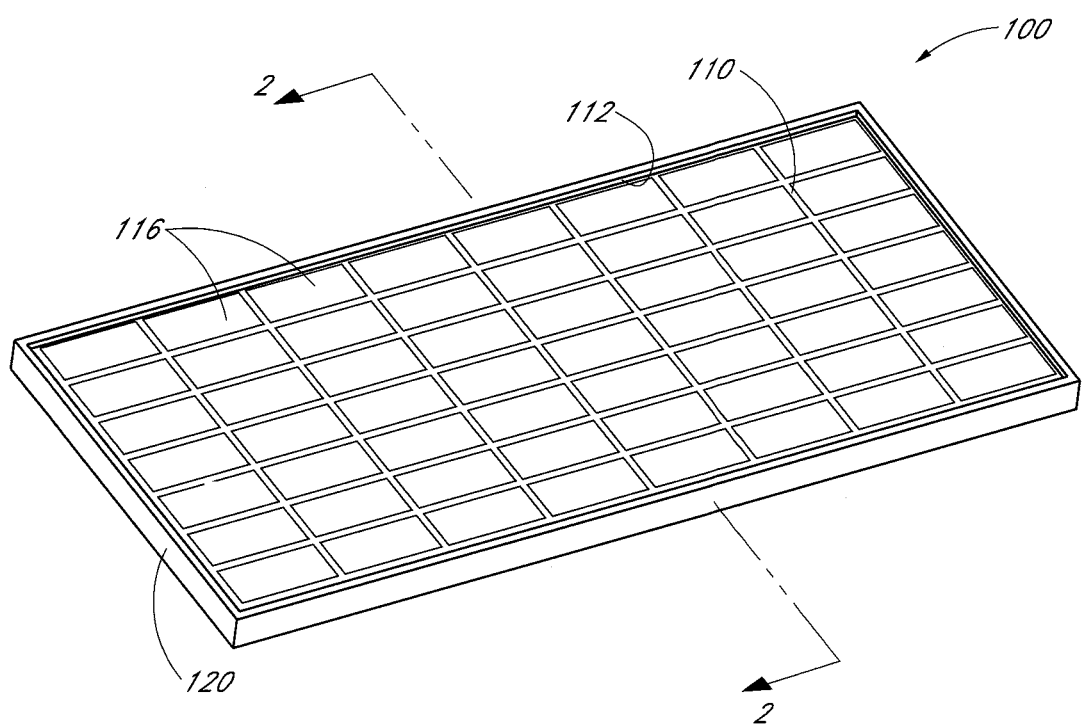
FIG. 1 is a perspective view of a photovoltaic module.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Some ways to improve the cost of energy provided by a photovoltaic solar system are to reduce the complexity of its components, thereby reducing the cost of materials and construction, to increase the performance of the system, thereby increasing the power obtained for the same cost as the unimproved system, and, to reduce the weight of the system, thereby reducing its shipping cost. When possible, it is desirable to simultaneously affect several of these factors.

A photovoltaic module is disclosed. The photovoltaic module has a first side directed toward the sun during normal operation and a second, lower side. The photovoltaic module comprises a perimeter frame and a photovoltaic laminate at least partially enclosed by and supported by the perimeter frame. The photovoltaic laminate comprises a transparent cover layer positioned toward the first side of the photovoltaic module, an upper encapsulant layer beneath and adhering to the cover layer, a plurality of photovoltaic solar cells beneath the upper encapsulant layer, the photovoltaic solar cells electrically interconnected, a lower encapsulant layer beneath the plurality of photovoltaic solar cells, the upper and lower encapsulant layers enclosing the plurality of photovoltaic solar cells, and a homogenous rear environmental protection layer, the rear environmental protection layer adhering to the lower encapsulant layer, the rear environmental protection layer exposed to the ambient environment on the second side of the photovoltaic module.

A photovoltaic laminate is also disclosed. The photovoltaic laminate comprises a plurality of photovoltaic solar cells, each of the solar cells having a upper side facing the sun during normal operation and a lower side facing away from the sun, an encapsulant layer surrounding and enclosing the solar cells, the encapsulant layer extending between gaps in the solar cells, a transparent cover layer disposed above the upper side of the plurality of solar cells and atop the encapsulant layer, the encapsulant layer adhering to the cover layer, and a mono-stratum sealing layer below the lower side of the plurality of solar cells and beneath the encapsulant layer, the encapsulant layer adhering to the sealing layer along an inner surface and having an outer surface exposed to the ambient environment.

A backsheet for a photovoltaic laminate is also disclosed. The backsheet comprises a homogenous encapsulant layer and a homogenous outer layer, wherein the encapsulant layer and outer layer are jointly formed by co-extrusion, the encapsulant layer adhering to the outer layer, the encapsulant layer has a volume resistivity of at least $5\times10^{13}$ oh-cm, the outer layer is resistive to fluids, the encapsulant layer has a thickness of at least 400 micrometers, and the backsheet has an overall thickness of less than 400 micrometers.

A photovoltaic laminate can be constructed using a very high volume resistivity encapsulant surrounding the solar cells within the laminate. Previously, such encapsulants encountered difficulties with certain aspects of their composition, such as undesirable yellowing or wearing during solar irradiation, lack of or excessive stiffness, inability to be cheaply produced or processed. Accordingly, encapsulants in use have been deployed in combination with a thick backsheet behind the solar cells and encapsulant. The backsheet exhibited certain qualities desirable for the photovoltaic solar module, such as environmental protection, mechanical stiffness, electrical insulation, and so on, which were deficient in the encapsulant.

The inventors have discovered that a certain class of materials used as encapsulants advantageously satisfy many of the requirements of a photovoltaic solar module. A polyolefin, such as polyethylene or polypropylene, can be used as an encapsulant for solar cells. The volume resistivity of certain polyethylenes, including a value above $5\times10^{13}$ ohm-cm over a temperature range of −40 to 90 C, has beneficial effects on both the front surface of the solar cells, where polarization is inhibited, as well as electrical insulating properties on the rear surface. The associated increase in efficiency while still meeting performance specifications enables a further improvement.

The inventors have further developed a photovoltaic module and laminate construction which reduces material complexity and manufacturing steps to reduce cost of construction. Instead of a multi-layer backsheet bonded to the encapsulant, wherein the backsheet includes an electrical insulator, multiple bonding layers, an environmental layer, and, in some backsheets, a hybrid encapsulant-adhesive layer, a photovoltaic module can be constructed with a laminate containing a particular encapsulant and mono-layer film on the underside of the laminate. Such an advanced laminate can be constructed from an encapsulant-protective layer co-extrusion, eliminating the need to bond the encapsulant to a backsheet. The simplified protective layer, coupled with the easier construction can greatly reduce manufacturing costs. The compatibility of encapsulant and the mono-layer films can be also improved by surface treatment techniques, including corona treatment and plasma treatment.

FIG. 1 illustrates a photovoltaic module 100. The photovoltaic module 100 can be constructed by surrounding a photovoltaic laminate 110 by a frame 120 extending around the perimeter 112 of the laminate 110. The laminate 110 can contain a number of photovoltaic solar cells 116, which can be interconnected together. Several photovoltaic modules 100 can be combined to create a solar array or solar system for use in converting sunlight to electrical energy.

Figure 2:
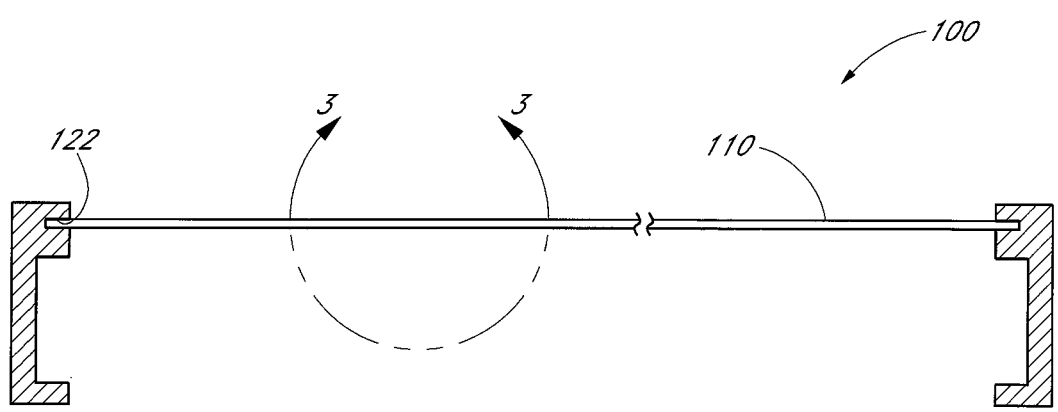
FIG. 2 is a cross-sectional view of the photovoltaic module of FIG. 1.

The frame 120 can surround the laminate 110 on all sides, or on several. The frame 120 can extend entirely along the edges of the laminate 110 or only partially, such as with voids or notches, if desired. The frame 120 can be constructed of a metal, such as aluminum or stainless steel, a plastic, or any other selected material. With reference to FIG. 2, where a cross-section of the photovoltaic module 100 is shown, the frame 120 can include a notch 122 to receive and support the laminate 110.

Figure 3:
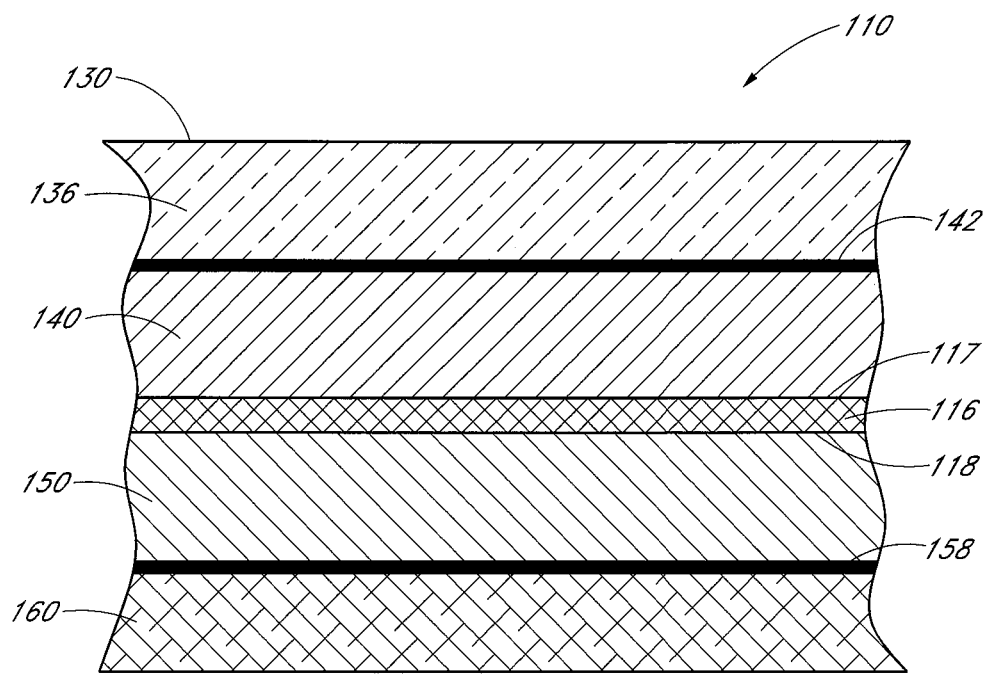
FIG. 3 is a detailed view of the photovoltaic module of FIG. 2, illustrating a cross-section of an embodiment of a photovoltaic laminate.

The laminate 110 is a term for the component which includes the photovoltaic solar cells 116 and the several layers of enclosing and supporting materials. FIG. 3 illustrates a detailed view of the embodiment of the laminate 110 shown in FIGS. 1 and 2. As can be seen, the laminate 110 can be composed of several materials. The illustrated embodiments are for descriptive purposes only and are not to scale. The laminate 110 illustrated has a top surface 130 which is disposed to face the sun during normal operation. Similarly, the solar cells 116 within the laminate 110 can have upper and lower faces, wherein the upper face 117 is directed toward the sun during normal operation and the lower face 118 is directed away.

The laminate 110 can have a transparent cover layer 136. The cover layer 136 can be constructed of a clear, or translucent, material, such as glass or a plastic. The cover layer 136 can be treated with, formulated with, or have applied atop it an anti-reflective material or coating to inhibit loss of photons at the surface of, or through, the cover layer 136.

Beneath the cover layer 136 can be a front, top, or upper encapsulant layer 140. In certain embodiments, a bonding or adhesive layer 142 can be disposed between the cover layer 136 and upper encapsulant layer 140. The adhesive layer 142 can be uniformly distributed, or selectively deposited between the cover and upper encapsulant layers 136, 140. The adhesive layer can be any bonding, glue, affixation, or adhesion material.

Figure 4:
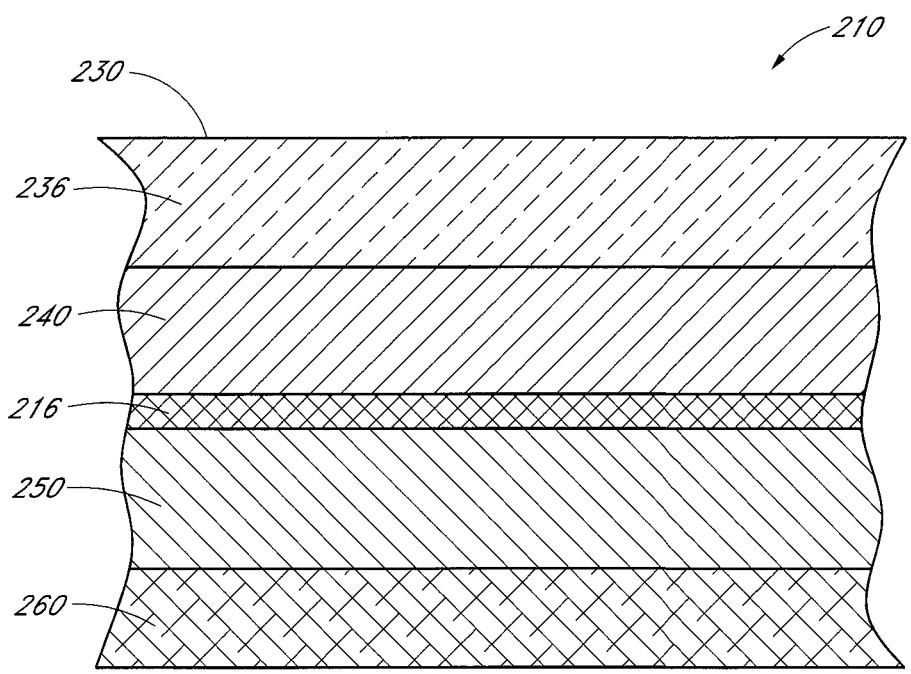
FIG. 4 is a detailed view of a cross-section of another embodiment of a photovoltaic laminate.

The upper encapsulant layer 140 is so called because it is positioned above the upper side 117 of the solar cell(s) 116. The upper encapsulant layer 140 can, however, extend between gaps in the solar cells 116 to contact and, in some constructions and embodiments, merge with the lower encapsulant layer 150, which extends beneath the solar cells 116. The upper and lower encapsulant layers 140, 150 can entirely surround and contain the solar cells 116, electrically insulating them from the cover layer 136 and the sealing layer 160. In some embodiments, a lower adhesive layer 158, having characteristics similar to those described with respect to the adhesive layer 142 can be present between the lower encapsulant layer 150 and sealing layer 160. As shown in the embodiment illustrated in FIG. 4, the adhesive layers 142, 158 can be omitted. In such embodiments, the encapsulant layers 240, 250 can include any properties necessary to bond with the surrounding components. Unless otherwise specified, numerical indicators in FIG. 4 designate components similar to those of FIGS. 1-3, except that the number has been incremented by 100.

The encapsulant layers 140, 150 can be composed of identical materials, allowing for a uniform enclosure of the solar cells 116. In some embodiments, heating the encapsulant layers 140, 150 when in physical proximity can cause melding or fusing to form a single layer extending around and between the solar cells 116. In other forms the encapsulant layers 140 and 150 may be composed of dissimilar materials, and still completely enclosing the solar cells 116.

The encapsulant layers 140, 150 can be formed of a polyolefin material, such as polyethylene, or polypropylene. Whether polyethylene, or propylene, or any other polyolefin, the encapsulant used can have a Young's modulus less than 10 MPa at room temperature or higher temperatures. In certain embodiments, the encapsulant layers 140, 150 can have a volume resistivity of at least $5\times10^{13}$ ohm-cm at normal operating temperature. Such a normal operating temperature can be between −40° and 90° C. Thus, the encapsulant material can have a volume resistivity of at least $5 \times 10^{13}$ ohm-cm at 60°, or at 90°, or any other temperature value desired. The upper encapsulant layer 140 can have a transparency sufficient to permit passage of at least 60 percent of entering photons at each wavelength of light between 300 to 1200 nm. The lower encapsulant layer 150 can be transparent, colored, highly reflective, or can have other optical or reflective properties as desired for the embodiment. Certain embodiments can have a combination of colored and highly reflective properties. In certain embodiments, the encapsulant layers 140, 150 can have a mechanical stiffness characterized by a Young's modulus of less than 10 MPa at room temperature and higher temperatures. In some embodiments, the encapsulant layers 140, 150 can have a thermal conductivity of at least 0.2 W/(m-K). Thus, while polyethylene is described as an exemplary material, any polyolefin or other material which has these or similar properties can also serve as an encapsulant material. One collection of materials which can be used as upper or lower encapsulant layers is described in U.S. patent application Ser. No. 12/818,959, filed on Jun. 18, 2010, the entirety of which is expressly incorporated herein by reference.

The sealing layer 160 can be any single-layer, homogenous film sufficient to provide environmental protection to the other layers of the laminate 110. The sealing layer 160 can have a moisture vapor transmission rate less than 40 g/m² per 24 hours, a rate which is described herein as being resistive to fluid, and can be constructed of any appropriate material. For example, a flouropolymer, a polyvinylidene fluoride, a polytetrafluoroethylene, polypropylene, polyphenylene sulfide, polyester, polycarbonate, polyacrylate, polyamide, or polyphenylene oxide can all be used in certain embodiments, including commercial forms of the materials, such as TEFLON™ or TEDLAR™. Any other appropriate material for use as a single-stratum layer can also be used. The sealing layer 160 can therefore serve as an environmental protection layer. The homogenous, mono-stratum sealing layer 160 can be a film or single layer, as opposed to the multi-layered backsheets of other photovoltaic modules. Therefore, the sealing layer 160 can, in some embodiments, be the sole stratum between the lower encapsulant layer 150 and the ambient environment beneath the laminate 110. In some embodiments, the sealing layer 160 can be a fiberglass layer or a thermally-conductive layer, such as a metal layer or a polymer containing conductive fillers.

In certain embodiments, the sealing layer 160 can be co-extruded with the lower encapsulant layer 150 for simplicity of manufacture. Either the lower encapsulant layer 150 or the sealing layer 160 can have a white or black color as desired for the embodiment. Other colors can be chosen as desired for the embodiment, including any color in the spectrum. The lower encapsulant layer 150 can have a thickness of between 100 and 800 micrometers, as desired for the embodiment. Additionally, the sealing layer 160 can have a thickness between 100 and 800 micrometers. Any combination can be used to form the overall thickness of the pair as desired by the embodiment.

With reference again to FIGS. 1-3, the combination of lower encapsulant layer 150 and sealing layer 160 can be used to prove electrical insulation between the lower surface 118 of the solar cells 116 and contact with a person touching the underside of the sealing layer 160. Because certain embodiments of the photovoltaic modules 100 comply with specifications requiring safe physical contact with the underside of the module while the solar cells 116 are operating at an electrical potential of as much as 1,000 volts, the encapsulant/sealing layer combination can insulate sufficiently to permit less than 10 micro-amperes of current flowing under such conditions. Alternatively, when the solar cells 116 are operating at 1,500V the combination can electrically insulate sufficiently to permit less than 25 micro-amperes of current. Similarly, the combined structure of the lower encapsulant layer 150 and sealing layer 160 can inhibit more than 50 micro-amperes of leakage current from passing when a continuous voltage of 3000 volts is present in lower surface 118 of the solar cells 116 for at least 1 minute.

Figure 5:
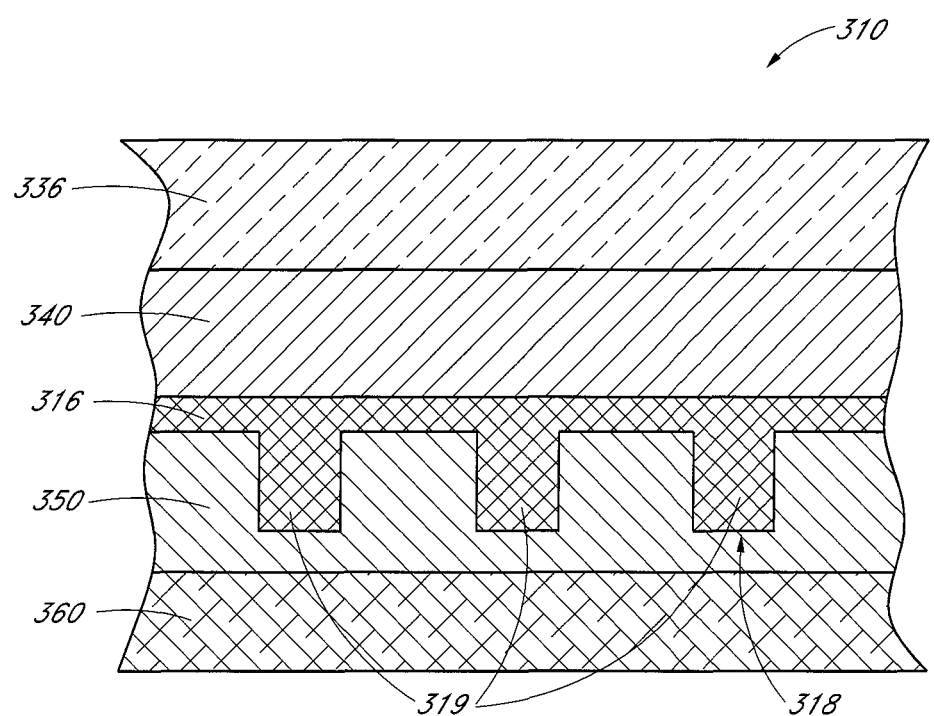
FIG. 5 is a detailed view of a cross-section of yet another embodiment of a photovoltaic laminate.

In certain embodiments, the solar cells 116 can be back contact and/or back-junction photovoltaic solar cells. FIG. 5 illustrates a detailed view of an alternative embodiment of a photovoltaic laminate 310. Unless otherwise specified, numerical indicators in FIG. 5 designate components similar to those of FIGS. 1-3, except that the number has been incremented by 200. FIG. 5 illustrates an exaggerated view of the lower surface 318 of the solar cells 316 to emphasize the surface features 319 of a back contact solar cell. As can be seen, the lower encapsulant layer 350 can be sufficiently thick to extend into any features of the solar cell 316 to inhibit contact between the surface features 319 of the solar cell 316 and the sealing layer 360. In those embodiments wherein electrical current between the surface of the sealing layer 360 and the lower surface 318 of the solar cell 316 at a particular operating electrical potential, such as 1,000 volts, is a desired feature or requirement for the photovoltaic module, the lower encapsulant layer 350 can be sufficiently thick to provide the desired electrical insulation.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A photovoltaic module having a first side directed toward the sun during normal operation and a second side, the photovoltaic module comprising:
   a perimeter frame; and
   a photovoltaic laminate at least partially enclosed by and supported by the perimeter frame, the photovoltaic laminate comprising:
      a transparent cover layer positioned toward the first side of the photovoltaic module;
      an upper encapsulant layer beneath and adhering to the cover layer;
      a plurality of photovoltaic solar cells beneath the upper encapsulant layer, the photovoltaic solar cells electrically interconnected;
      a lower encapsulant layer beneath the plurality of photovoltaic solar cells, the upper and lower encapsulant layers enclosing the plurality of photovoltaic solar cells, wherein the lower encapsulant layer extends in gaps between adjacent raised features of the plurality of photovoltaic solar cells; and
      a homogenous rear environmental protection layer that is co-extruded with the lower encapsulant layer, the homogenous rear environmental protection layer adhering to the lower encapsulant layer, the homogenous rear environmental protection layer exposed to the ambient environment on the second side of the photovoltaic module.

2. The photovoltaic module of claim 1, wherein the homogenous rear environmental protection layer comprises a material selected from a group including: a fluoropolymer, a polyvinylidene fluoride, a polycarbonate, a polyester, a polypropylene, a polyphenylene sulfide, a polyphenylene oxide, polyacrylate, polyamide, and a polytetrafluoroethylene.

3. The photovoltaic module of claim 1, wherein the lower encapsulant layer has a volume resistivity of at least $5\times10^{13}$ ohm-cm at 50 degrees Celsius.

4. The photovoltaic module of claim 1, wherein the lower encapsulant layer has a white color.

5. The photovoltaic module of claim 3, wherein the lower encapsulant layer is at least partially composed of a polyethylene.

6. The photovoltaic module of claim 3, wherein the lower encapsulant layer is at least partially composed of polyolefin.

7. The photovoltaic module of claim 1, wherein the plurality of photovoltaic solar cells comprise back contact solar cells.

8. The photovoltaic module of claim 1, wherein the lower encapsulant layer has a thickness of less than 650 micrometers.

9. The photovoltaic module of claim 1, wherein the homogenous rear environmental protection layer has a thickness of less than 400 micrometers.

10. The photovoltaic module of claim 1, wherein the cover layer comprises an anti-reflective coating.

11. A photovoltaic laminate comprising:
    a plurality of photovoltaic solar cells, each of the plurality of photovoltaic solar cells having an upper side facing the sun during normal operation and a lower side facing away from the sun;
    an encapsulant layer surrounding and enclosing the plurality of photovoltaic solar cells, the encapsulant layer extending in gaps between adjacent raised features of the plurality of photovoltaic solar cells;
    a transparent cover layer disposed above the upper side of the plurality of photovoltaic solar cells and atop the encapsulant layer, the encapsulant layer adhering to the cover layer; and
    a mono-stratum sealing layer below the lower side of the plurality of photovoltaic solar cells and beneath the encapsulant layer, the encapsulant layer adhering to the mono-stratum sealing layer along an inner surface and the mono-stratum sealing layer having an outer surface exposed to the ambient environment, the mono-stratum sealing layer being co-extruded with at least part of the encapsulant layer.

12. The photovoltaic laminate of claim 11, wherein the mono-stratum sealing layer is resistive to fluid.

13. The photovoltaic laminate of claim 11, wherein the encapsulant layer has a volume resistivity greater than $5\times10^{13}$ at 50° Celsius.

14. The photovoltaic laminate of claim 11, wherein the encapsulant layer and the mono-stratum sealing layer combine to permit less than 10 micro-amperes of electrical current to flow between the lower side of the plurality of photovoltaic solar cells and the outer surface of the mono-stratum sealing layer when the electrical potential difference between the lower side of the plurality of photovoltaic solar cells and the outer surface of the mono-stratum sealing layer is at least 1,000 volts.

15. The photovoltaic laminate of claim 11, further comprising a bonding layer between the mono-stratum sealing layer and the encapsulant layer.

16. The photovoltaic laminate of claim 11, wherein the combined thickness of the encapsulant layer and the mono-stratum sealing layer between the lower side of the plurality of photovoltaic solar cells and the outer surface of the mono-stratum sealing layer is less than 600 micrometers.

\* \* \* \* \*